United States Patent [19]

Takada

[11] Patent Number: 5,046,161
[45] Date of Patent: Sep. 3, 1991

[54] FLIP CHIP TYPE SEMICONDUCTOR DEVICE

[75] Inventor: Norimasa Takada, Tokyo, Japan

[73] Assignee: NEC Corporation, Tokyo, Japan

[21] Appl. No.: 314,166

[22] Filed: Feb. 22, 1989

[30] Foreign Application Priority Data

Feb. 23, 1988 [JP] Japan .................................. 63-41180

[51] Int. Cl.$^5$ ...................... H01L 21/66; H01L 29/34
[52] U.S. Cl. ........................................ 357/69; 357/68; 357/54; 357/72
[58] Field of Search ............................ 357/69, 68, 72

[56] References Cited

U.S. PATENT DOCUMENTS

| 3,902,148 | 8/1975 | Drees et al. ............................ 357/69 |
| 4,205,099 | 5/1980 | Jones et al. ............................ 427/90 |
| 4,224,002 | 1/1981 | Sato et al. ............................. 357/69 |
| 4,514,751 | 4/1985 | Bhattacharya ........................ 357/71 |
| 4,618,878 | 10/1986 | Aoyama et al. ...................... 357/72 |
| 4,706,106 | 11/1987 | Shiba et al. ........................... 357/74 |
| 4,733,289 | 3/1988 | Tsurumaru ....................... 357/71 R |
| 4,761,386 | 8/1988 | Buynoski .............................. 357/69 |

FOREIGN PATENT DOCUMENTS

| 0061593 | 10/1982 | European Pat. Off. ............... 357/66 |
| 0122631 | 10/1984 | European Pat. Off. ............... 357/71 |
| 0068970 | 6/1978 | Japan ................................. 357/71 R |
| 54-162458 | 12/1979 | Japan . |
| 55-156339 | 12/1980 | Japan . |
| 0147464 | 11/1981 | Japan ..................................... 357/71 |
| 57-73952 | 5/1982 | Japan ................................... 437/183 |
| 0200526 | 11/1983 | Japan ..................................... 357/71 |
| 62-128154 | 6/1987 | Japan . |
| 63-318742 | 12/1988 | Japan . |

OTHER PUBLICATIONS

Noubel et al, "Metallurgy Including a Chromium Slice", IBM Technical Disclosure, vol. 11, No. 7, Dec./68, p. 769.

Marc Wittmer, "Barrier Layers: Principles and Applications in Microelectronics", J. Vac. Sci. Technology, Apr.-Jun. 84, pp. 273-280.

Primary Examiner—Andrew J. James
Assistant Examiner—Viet Q. Nguyen
Attorney, Agent, or Firm—Helfgott & Karas

[57] ABSTRACT

A flip chip type semiconductor device includes a substrate, a polyimide film and an inorganic passivation film. An opening having a rectangular configuration is formed in the inorganic passivation layer provided on an electrode pad. The polyimide film is formed within the opening and on the inorganic passivation layer only in the vicinity of the opening so that the polyimide film is not formed on a circuit element of the semiconductor device. A circular window is formed in the polyimide film within the opening. A bump structure formed in the window is electrically connected to the electrode pad.

10 Claims, 4 Drawing Sheets

FLIP CHIP TYPE SEMICONDUCTOR DEVICE

FIELD OF THE INVENTION

The present invention relates to a flip chip type semiconductor device, and more particularly to the device using a polyimide film on the substrate.

DESCRIPTION OF THE RELATED ART

A polyimide film can be formed on a semiconductor substrate (wafer) by a spin-coating process similarly to the photo-resist coating and has many beneficial properties, that is, high resistances to a relatively high temperature, to organic solvents, and to radiations. Therefore, the polyimide film has been widely used in semiconductor devices as a passivation film which substantially covers the substrate. Further, in flip chip type semiconductor devices, the polyimide film as the passivation film has been used for defining positions of solder bump terminals; they are formed in apertures provided in the film. The technology is described in U.K. patent 1,230,421, for example. On the other hand, there has been also proposed a flip chip type semiconductor device having a composite passivation insulating film consisting of an inorganic insulating film as a lower film and a polyimide film as an upper film, which is as shown in Laid-open Japanese Patent Application No. 53-68163, for example. According to the Laid-open publication, apertures are formed in the composite film with the same figure in the polyimide film and in the inorganic insulating film, and then solder bumps are formed in the apertures to contact electrode pads thereunder. In this case, if the aperture commonly formed in the polyimide film and in the inorganic film is of a rectangular plan shape, the bottom surface of each bump consisting of a solder bump terminal or of a solder bump terminal and a barrier metal film becomes rectangular and it is difficult to shape the solder bump in a spherical shape with the result being the non-uniformity of the height of the solder bumps. Consequently, when the semiconductor pellet having the non-uniformity solder bumps is mounted to a substrate of a package or a print board by melting the solder bumps in the face-down bonding arrangement, such a structure induces insufficient connection and reduces the production yield and reliability. To the contrary, if the common aperture is of a circular in plan, the problem can be solved. In this case, however, merits of a mass-production for fabricating semiconductor devices cannot be obtained, because for obtaining the merits, the intermediate products after finishing the process step for forming apertures in the inorganic insulating film must be adapted to usual bonding wire type semiconductor devices as well as to the flip chip type semiconductor devices. Whereas the bonding wire type semiconductor devices necessitate the apertures to be rectangular plan shape, that is, rectangular exposed bonding pads.

Moreover, in the prior art structure the polyimide film is used as a passivation film, and therefore it covers the entire surface of the semiconductor pellet. Accordingly, the conventional semiconductor device involves the following problems.

The polyimide film generates a large stress due to the volume change when it hardens and undergoes shrinkage. Moreover, it has a linear expansion coefficient of $60 \times 10^{-6}$ (1/°C.) which is about ten times as great as that of silicon forming the semiconductor pellet. Accordingly, degradation of circuit characteristics and cracks are likely to occur. Furthermore, in high density semiconductor pellets such as DRAMs having 250K bits, 1M bits or more, a wiring layer on the semiconductor pellet is extremely thin such as 1 μm or below and the wiring pattern tends to get deviated or cut due to the influences of the polyimide film formed as the upper layer. This induces the drop in production yield and reliability.

SUMMARY OF THE INVENTION

Accordingly, an object of the present invention is to provide a flip chip type semiconductor device which has properties of high reliability and can be fabricated in a high production yield with obtaining merits of a mass-production manner.

According to one feature of the present invention, there is provided a flip chip type semiconductor device which comprises a semiconductor substrate, a field insulating layer selectively formed on the substrate to expose an active region of the substrate, an impurity region formed in the active region of the substrate to constitute a circuit element, an electrode pad formed on the field insulating layer and connecting electrically to the circuit element, an inorganic passivation layer of silicon nitride, silicon oxide or other glass layer formed above the whole surface of the substrate so as to cover the circuit element including the impurity region, the field insulating layer and the electrode pad, entirely, an opening formed in the inorganic passivation layer on the electrode pad to expose an area of the electrode pad in a rectangular or square plan shape, a polyimide film formed in the opening and on a defined surface part of the inorganic passivation insulating layer in the vicinity of the opening such that the polyimide film is free from above the circuit element, a window formed in the polyimide film within the opening of the inorganic passivation insulating layer to expose an area of the electrode pad in a circular plan shape, a barrier metal film formed in the window of the polyimide film, and a solder bump terminal formed on and electrically connected to the exposed circular surface area of the electrode pad via the barrier metal film.

According to another feature of the present invention, there is provided a flip chip type semiconductor device which is installed in a package and comprises a circuit element forming portion forming a plurality of circuit elements, a bump terminal forming portion forming a plurality of bump terminal structures, and connecting means connecting electrically respective the bump terminal structures in the bump terminal forming portion to corresponding the circuit elements in the circuit element forming portion, respectively;

said circuit element forming portion including a first section of a semiconductor substrate having a major surface, a first field insulating layer selectively formed on the major surface of the first section of the substrate and surrounding active regions in the first section of the substrate, impurity regions formed in the active regions, internal wiring layers formed on the first section of the substrate and connecting to corresponding the impurity regions and/or to each other to constitute the circuit elements with the impurity regions, thin insulating films formed on the active regions and on the first field insulating layer, and an inorganic passivation insulating layer such as a silicon nitride layer, a silicon oxide layer and/or other glass layer continuously formed and covering the active regions, the first field insulating layer, the thin insulating films and the internal wiring layers, entirely;

the bump terminal forming portion including a second section of the semiconductor substrate, a second field insulating layer entirely formed on the major surface of the second section of the substrate, the second field insulating layer being continuously formed from the first field insulating layer in the circuit element forming portion so as to provide under the connecting means, electrode pads formed on the second field insulating layer, an inorganic passivation insulating layer covering the electrode pads and the second field insulating layer and formed continuously from the inorganic passivation insulating layer in the circuit element forming portion so as to cover the connecting means, openings formed in the inorganic passivation insulating layer to expose surface areas of respective the electrodes pads, each of the openings having a rectangular or square plan shape, polyimide films formed in respective the openings and on the inorganic passivation insulating layer in the bump terminal forming portion, the polyimide films being only provided restrictively in the bump terminal forming portion between the bump terminal forming portion and the circuit element forming portion, windows formed in respective the polyimide films within the openings to expose surface areas of respective the electrode pads, each of the windows having a circular plan shape, and solder bump terminals formed on the electrode pads and electrically connected to the circular surface areas of the electrode pads through the windows, respectively, whereby each of the electrode pads, each of the polyimide films and each of the solder bump terminals constitute each of the bump terminal structures. The solder bump terminal may be connected to the electrode pad through a barrier metal which constitutes the bump terminal structure.

The polyimide film having favorably a thickness ranging from 0.5 μm to 1.2 μm may has a circular plan shape having favorably a diameter ranging from 200 μm to 600 μm to cover the rectangular electrode pad and not to extend on the circuit element forming portion. Or else, when first and second bump terminal structures among the bump terminal structures are formed at positions adjacent to each other, the polyimide films belonging to the first and second bump terminal structures may be contacted each other at their peripheral sections on the inorganic passivation layer in the bump terminal forming portion. Generally, the connecting means is constituted a wiring layer of aluminum, for example, and connected at one side continuously to the electrode pad of the bump terminal structure, and is connected at the other side to the impurity region or to the internal wiring constituting the circuit element and/or the circuit in the circuit element forming portion.

The package is favorably of a hermetically sealing type package, that is, a ceramic package or a glass-sealed package so that the surface of the inorganic passivation insulating layer in the circuit element forming portion is exposed to gas sealed in the package; the gas is inert gas such as nitrogen gas or is air.

According to the present invention, the opening in the inorganic passivation film is of the rectangular or square plan shape, and therefore, the intermediate products after finishing the process steps to form the opening, that is, the rectangular bonding pad, can be adapted to bonding wire type semiconductor devices as well as flip chip type semiconductor devices, thereby obtaining effects of a mass-productivity; easiness of manufacturing control, low cost production, etc. The window in the polyimide film has a circular plan shape, and therefore, the height of the solder bumps in one pellet becomes uniform. Consequently, a reliable face-down connection can be realized. Further, the window in the polyimide film is formed within the opening in the inorganic passivation film. Therefore, the corner of the opening which would be sharply formed is covered by the polyimide film which has fluidized nature; the upper surface over the corner becomes smooth. Consequently, the barrier metal films formed on the polyimide films above the corner of the openings in the inorganic passivation film are hardly broken.

Moreover, the present invention forms the polyimide film within a limited area around the electrode pads in such a manner as not to cover the circuit area, and can thus eliminate the influences of the stress of the polyimide film and the like. Accordingly, the present invention can prevent the deviation of the wiring pattern, the breakage of the wirings, the occurrence of cracks and the degradation of circuit characteristics and can improve the production yield and reliability. The effect of the present invention is all the more remarkable particularly for semiconductor devices having the fine wirings such as DRAMs having 1M bits or more.

The above and further objects, features and advantages of the present invention will become more apparent from the following detailed description taken in conjunction with the accompanying drawings.

DETAILED DESCRIPTION OF THE EMBODIMENTS

Figure 1A:
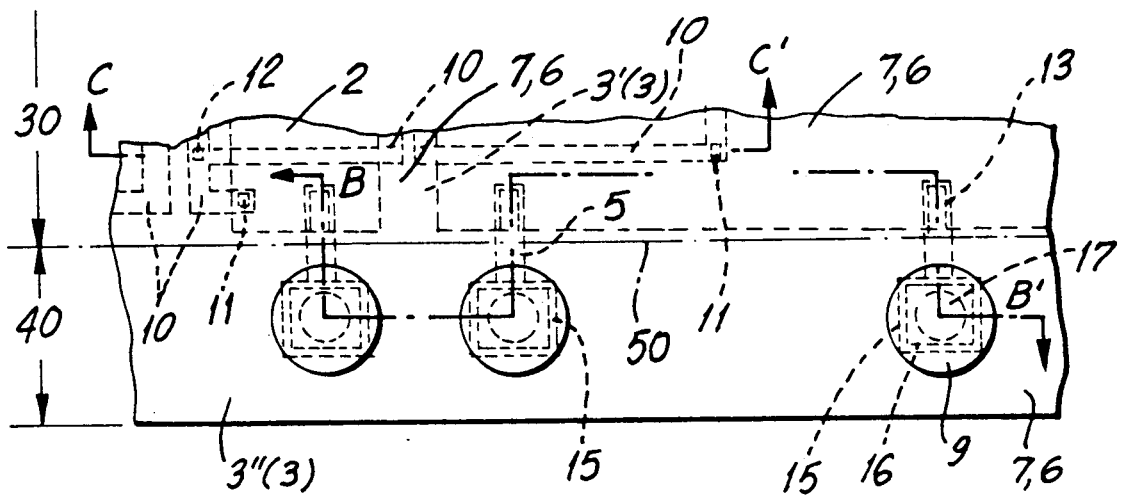
FIG. 1A is a plan view showing a flip chip type semiconductor device in which an effective combination of apertures for forming bump terminal structures.
Figure 1B:
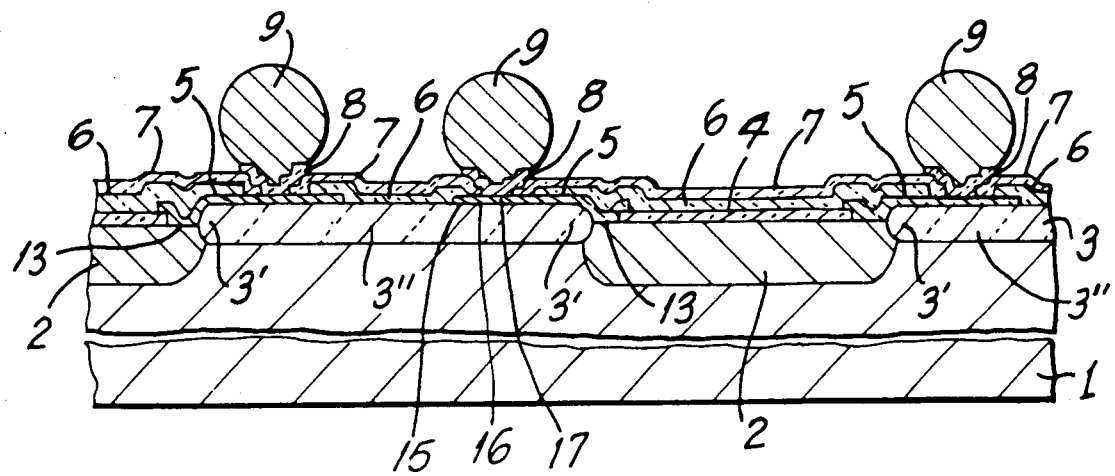
FIGS. 1B and 1C are cross-sectional views taken along lines B—B' and C—C' as viewed in the direction of arrows; respectively.
Figure 1C:
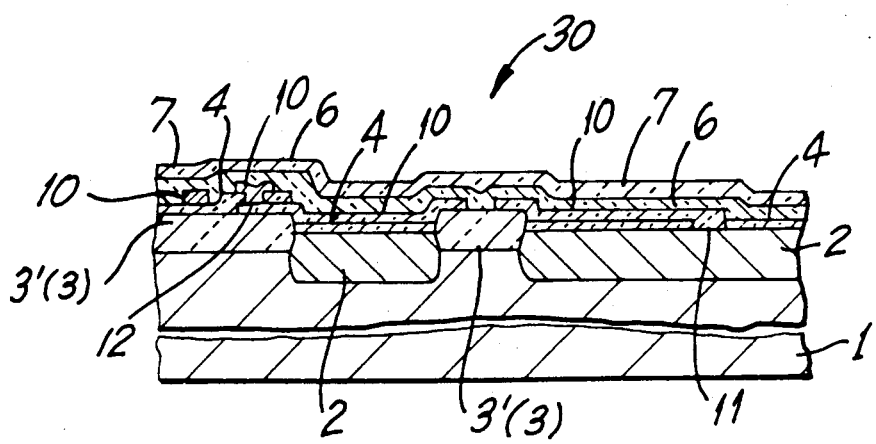

Referring to FIGS. 1A to 1C, a flip chip type semiconductor device having a favorable combination of apertures through which a solder bump is connected to a electrode pad thereunder will be explained. On a major surface of a P-type silicon substrate 1 a thick field silicon oxide layer 3 is thermally formed. The field oxide layer 3 consists of a first field silicon oxide layer 3' formed selectively in a circuit element forming portion 30 and a second field silicon oxide layer 3" formed entirely in a bump terminal forming portion 40. Although the boundary between the portions 30, 40 is represented by a phantom line 50 in FIG. 1A, the first and second field oxide layers 3', 3" are continuously formed as shown in FIG. 1B.

In the circuit element forming portion 30, active regions of the substrate 1 are surrounded by the first field oxide layer 3', and N-type impurity regions 2 are formed in the active regions. Further, a plurality of internal wiring layers 10 including electrodes such as gate electrodes are formed with thin insulating films 4 including inter-ply insulating films on the first field oxide layer 3' and on the impurity regions 2 in the active regions. The internal wiring layers are connected each other at a contact part 12 and connected to the impurity regions 2 at contact parts 11. The impurity regions 2 and the internal wiring layers 10 constitute circuit elements such as diodes, transistors, resistors, etc. and/or circuits. Therefore, it is defined that the circuit element forming portion 30 is a portion where all of the internal wiring layers 10 and all of the active regions, the impurity regions 2 are formed, and that from the circuit element forming portion 30 only wiring layers 5, which are directly connected to bump terminal structures, can be led out.

In the bump terminal forming portion 40, the second field oxide layer 3" is entirely formed such that any impurity region for forming a circuit element or a circuit is not provided, and electrode pads 15 of aluminum having 1.0 μm thickness are formed on the second field oxide layer 3". Each of the electrode pads 15 has a square plan shape of 150 μm square and is connected to and is continuously formed with an aluminum wiring layer 5 having 1.0 μm thickness as a leading out or connecting means which is connected to the impurity region 2 constituting a circuit element in the circuit element forming portion 30. A silicon nitride film 6 of 1.0 to 1.5 μm thickness as an inorganic passivation insulating film is entirely formed in the whole portions 30, 40, and openings 16 are formed in the silicon nitride film 6 on the electrode pads 15. Each of the openings 16 has a square plan shape of 120 μm square, and therefore the upper surface of the electrode pad 15 is exposed in the same square shape. Next, a polyimide film 7 of 1.0 μm thickness is entirely formed in the openings 16 and on the silicon nitride film 6 in the whole portions 30, 40, and windows 17 are formed in the polyimide film 7 within the openings 16. Each of the windows 17 has a circular plan shape of 80 μm diameter, and therefore the upper surface of the electrode pad 15 is exposed in the same circular shape. Barrier metal films 8 are attached to the exposed upper surface of the electrode pads 15 through the circular window 17 and extend on the surface of the polyimide film 7 near the windows. Each of the barrier metal film has a circular plan shape of 150 μm diameter (not shown in FIG. 1A), and the center section of the upper surface of the barrier metal film 8 is shaped in a concavity having a circular plan shape due to the circular window 17 in the polyimide film 7. The barrier metal film 8 may be a composite film consisting of a titanium film or a chromium film as a lower film and a copper film as an upper film. Spherical solder bump terminals 9 made of eutectic alloy of lead (Pb) and tin (Sn) are formed on the barrier metal films 8. The barrier metal film is attached to the electrode pad at the circular contact portion and the upper surface of the barrier metal film becomes the circular concavity shape, and therefore, the bottom of the solder bump terminal becomes also circular shape thereby forming the solder bump terminal with a desirable spherical shape and a small deviation of the height among the terminals in one semiconductor device. Further, because of the rectangular opening in the inorganic passivation insulating film a beneficial mass-production of the device can be realized. However, the structure shown in FIG. 1 has the polyimide film which is entirely formed on the circuit element forming portion 30, and therefore, the production yield and reliability of the device are inevitably reduced.

Figure 2:
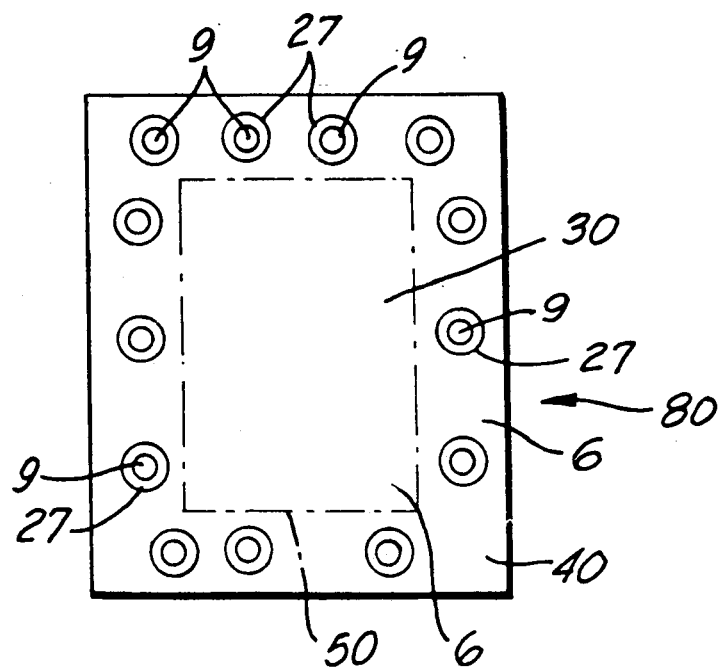
FIG. 2 is a plan view showing schematically an embodiment of the present invention.
Figure 3C:
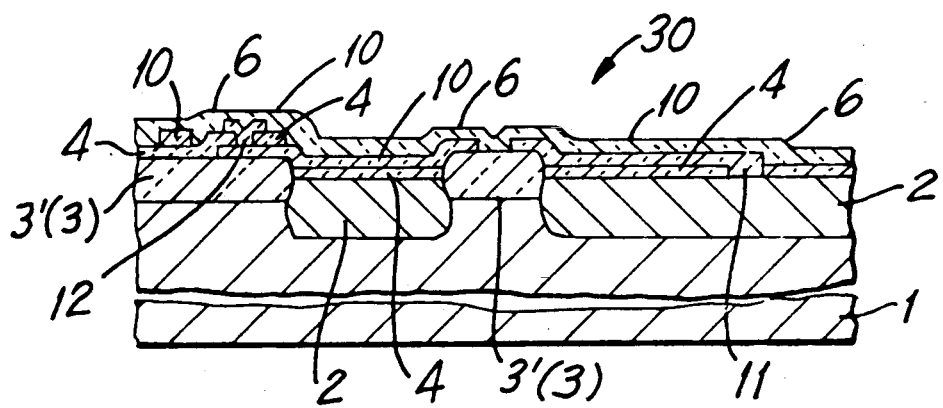
FIGS. 3B and 3C are cross-sectional views taken along lines B—B' and C—C' in FIG. 3A as viewed in the direction of arrows, respectively.
Figure 3A:
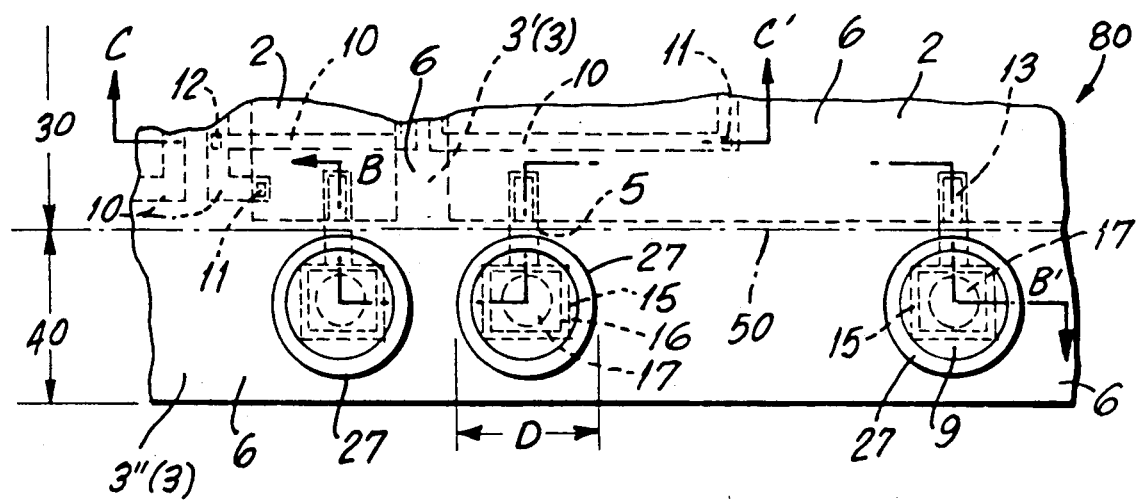
FIG. 3A is a plan view showing the embodiment of the present invention.
Figure 3B:
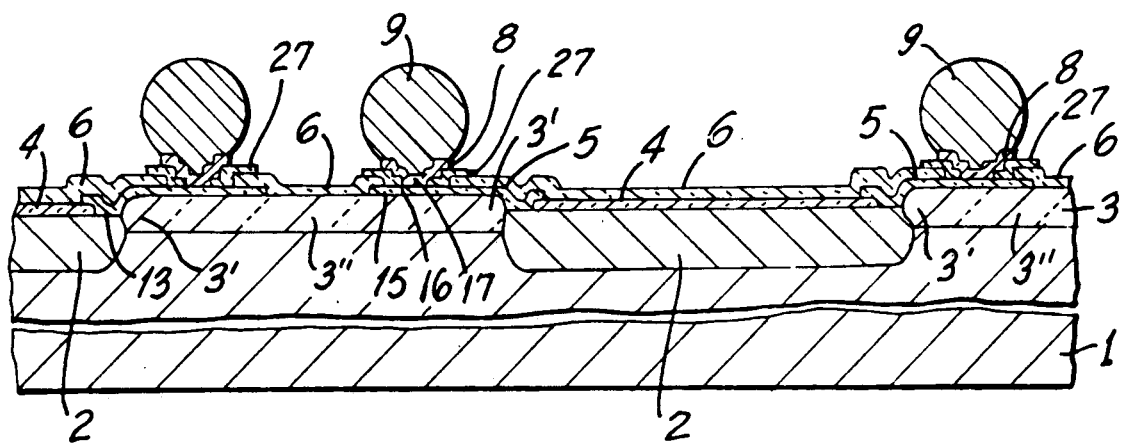

Referring to FIGS. 2 and 3A to 3C, an embodiment of the present invention will be explained, and in these figures the same components as those in FIGS. 1A to 1C are indicated by the same reference numerals. As shown in FIG. 2, the semiconductor device 80, that is, a semiconductor pellet or a semiconductor chip includes the circuit element forming portion 30 and the bump terminal forming portion 40 surrounding substantially the portion 30. In the bump terminal forming portion 40, a plurality of bump terminals 9 are formed, and a plurality of polyimide films 27 are formed only near the bump terminals such that at least at the whole surface of the circuit element portion 30, the inorganic passivation layer 6 is exposed. As shown in FIGS. 3A to 3C, a polyimide film is entirely removed from the circuit element forming portion 30 and is selectively removed from the bump terminal forming portion 40 to remain the polyimide films 27 when the windows 17 are formed by a photo-lithography process step. Each of the polyimide films 27 has the thickness ranging from 0.5 μm to 1.2 μm, for example, of 1.0 μm and a circular plan shape of the diameter ranging from 200 to 600 μm, for example, of 300 μm. The polyimide films 27 are formed only above a part of leading out wiring layers, respectively, but the films 27 are never formed in the circuit element forming portion 30 of the pellet and the passivation insulating film 6 of inorganic material is entirely exposed in the portion 30. That is, the polyimide films 27 are never formed on any of the impurity regions 2 and on any of the internal wiring layers 10. Therefore, the disadvantages involved in the structure shown in FIG. 1 can be eliminated.

Next, the fabrication steps of this embodiment will be explained.

After forming the inorganic passivation film 6 on the electrode pads 15, connecting wiring layers 5, thin insulating layers 4, impurity regions 2, internal wiring layers 10 and thick field insulating layer 3 entirely, the rectangular openings 16 are formed in the inorganic passivation insulating film 6. Next, an about 1 μm-thick polyimide film is formed by spin coating on the entire upper surface of the inorganic passivation film 6 inclusive of the openings 16, and the portions of the film on the electrode pads 15 are etched and bored circularly by photographic technique and at the same time, all the areas other than the portions from the openings to the outer peripheral portions of the electrode pads 15 are exclusively etched in order to form the polyimide films 27 which has circular windows on the electrode pads 15 and covers the inorganic passivation film 6 only on the electrode pads 15 and on the inorganic passivation film 6 around the pads 15. This polyimide films 27 are formed in such a manner as not to cover the circuit area. Then, the barrier metal film such as Ti-Cu, Cr-Cu or the like is formed on the electrode pads 15 and the polyimide films 27 and solder plating is selectively applied onto the electrode pads by use of a resist (not shown) for plating. After the resist for plating is peeled off, the barrier metal film is etched and successively to form the barrier metal films 8 shown in FIG. 3B, the solder-plated solder having mushroom-like figure is thermally fused and shaped (wet-back) to form the spherical solder bumps 9, thereby completing the flip chip type semiconductor device having the structure shown in FIG. 3B. The polyimide films 27 on the electrode pads 15 are formed preferably in such a manner as to cover the edges of the openings 16 of the inorganic passivation film 6, too, so as to protect the electrode pads 15.

Figure 4:
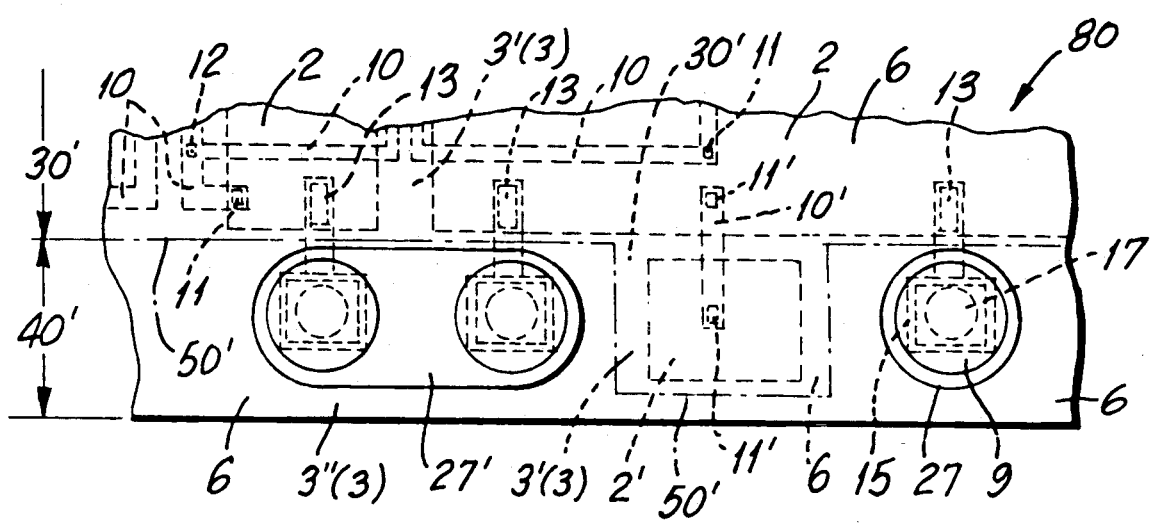
FIG. 4 is a plan view showing a modification of the embodiment of the present invention.

Referring to FIG. 4, a modification of the embodiment will be explained, and in the figure the same component as those in FIGS. 3A are indicated by the same reference numerals. An active region including an N-type impurity region 2' is formed between the bump terminal structures and an internal wiring layer 10' is connected to the impurity regions 2, 2' at contact parts 11', respectively. Therefore, the circuit element forming portion 30' becomes a convex plan shape and the bump terminal forming portion 40 becomes a concave plan shape with the boundary phantom line 50'. Further, the adjacent polyimide films are contacted on the passivation insulating layer 6 to form a combined polyimide film 27' belonging to two of bonding bump structures. In the modified structure also the polyimide films 27 including the combined polyimide film 27' are never elongated into the circuit element forming portion 30'. In this embodiment shown in FIG. 4, the circuit area does not exist between the adjacent electrode pads and when it is difficult to form individually the polyimide films, these polyimide films are integrated as the polyimide film 27'. This embodiment provides the advantage that the formation condition of the polyimide film can be mitigated.

Figure 5:
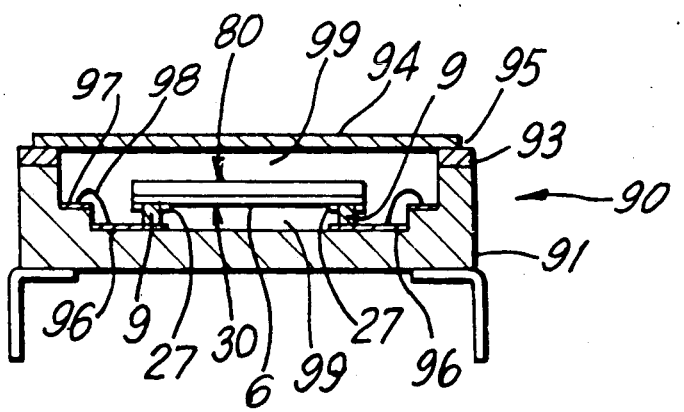
FIG. 5 is a cross-sectional view showing schematically in a state of installing the embodiment of the present invention within a package to complete a device.

The semiconductor pellet 80 according to the present invention is installed in a hermetically sealing type package such as a ceramic package or a glass-sealed package in which inert gas or air is sealed. FIG. 5 exemplifies a ceramic package 90 which comprises a ceramic body 91, outer leads 92, a weld ring 93, a lid 94, metallized lead layers 96, 97 and bonding wires 98. After the semiconductor pellet 80 is bonded at the solder bump terminals 9 to the metallized lead layers 96 by a facedown bonding fashion, the package is sealed by welding the lid 94 to the weld ring 93 at the portion 95, and in the package nitrogen gas 99 is filled so that the inorganic passivation insulating layer 6 in the circuit forming portion 30 of the pellet 80 is exposed to the nitrogen gas 99.

What is claimed is:

1. A flip chip type semiconductor device comprising a semiconductor substrate including a central portion and a peripheral portion and having a major surface on said central portion and said peripheral portion;

an insulating layer selectively formed on said major surface of said central portion and entirely covering said major surface of the peripheral portion;

circuit elements formed on said central portion;

electrode pads formed on said insulating layer provided on said peripheral portion, said electrode pads being electrically connected to said circuit elements;

a passivation layer of inorganic material formed over the entire surface of said central portion and the entire surface of said peripheral portion so as to cover said circuit elements and said insulating layer;

said passivation layer being formed with openings provided over said electrode pads so as to expose areas of said electrode pads of substantially rectangular configuration;

polyimide films formed in said openings and only on such parts of said passivation layer which are positioned near said openings and surround said openings, so that said central portion of said substrate remains free of said polyimide films;

said polyimide films being formed with windows provided within said openings of said passivation layer so as to expose areas of said electrode pads of a substantially circular configuration;

barrier metal films formed in said windows of said polyimide films, respectively; and solder bump terminals formed on and electrically connected to said areas of substantially circular configuration of said electrode pads via said barrier metal films, respectively, whereby degradation of circuit characteristics in the semiconductor device is avoided.

2. A flip chip type semiconductor device of claim 1, in which each of said polyimide films surrounds each of said openings with an encircled outer edge portion positioned on said passivation layer.

3. A flip chip type semiconductor device of claim 1, in which some of adjacent polyimide films are connected to each other so as to form a combined polyimide film for two adjacent solder bump terminals on said passivation layer.

4. A flip chip type semiconductor device of claim 1, in which said exposed areas in said openings in said passivation layer are of square configuration.

5. A flip chip type semiconductor device of claim 1, in which said semiconductor device is installed in a package which is a hermetically sealing type package, and in which a surface of said passivation layer on said central portion is exposed to a gas sealed in said package.

6. A flip chip type semiconductor device of claim 5, in which said gas is inert gas.

7. A flip chip type semiconductor device of claim 6, in which said inert gas is nitrogen gas.

8. A flip chip type semiconductor device of claim 5, in which said gas is air.

9. A flip chip type semiconductor device of claim 2, in which said encircled outer edge portion of each said polyimide film has a diameter ranging from 200 $\mu$m to 600 $\mu$m.

10. A flip chip type semiconductor device of claim 1, in which each said polyimide film has a thickness ranging from 0.5 $\mu$m to 1.2 $\mu$m.

* * * * *